(12) United States Patent
Guo et al.

(10) Patent No.: US 7,084,652 B2
(45) Date of Patent: Aug. 1, 2006

(54) NON-DESTRUCTIVE CONTACT TEST

(75) Inventors: Wen-Yuan Guo, Minsyong Township (TW); Chao-Yu Meng, Taichung (TW)

(73) Assignee: Toppoly Optoelectronics Corp., Chu-Nan (TW)

( * ) Notice: Subject to any disclaimer, the term of this patent is extended or adjusted under 35 U.S.C. 154(b) by 0 days.

(21) Appl. No.: 10/848,995

(22) Filed: May 18, 2004

(65) Prior Publication Data
US 2005/0077914 A1    Apr. 14, 2005

(30) Foreign Application Priority Data
Oct. 9, 2003   (TW) ............................... 92128046 A

(51) Int. Cl.
G01R 31/02   (2006.01)
G01R 1/07    (2006.01)

(52) U.S. Cl. .................. 324/754; 324/158.1; 439/179

(58) Field of Classification Search ......... 324/750–765
See application file for complete search history.

(56) References Cited

U.S. PATENT DOCUMENTS

RE32,024 E  *  11/1985  Greig ........................ 324/754
5,162,742 A  *  11/1992  Atkins et al. ............... 324/523
5,969,534 A  *  10/1999  Hubner et al. .............. 324/757

FOREIGN PATENT DOCUMENTS

JP   02002176081 A  *  6/2002
RU   1983-764461      *  11/1982

* cited by examiner

*Primary Examiner*—Vinh Nguyen
*Assistant Examiner*—Emily Y Chan
(74) *Attorney, Agent, or Firm*—Liu & Liu

(57) ABSTRACT

A non-destructive contact test method and apparatus for testing an electric characteristic of a test object is provided. The method includes providing an apparatus having a conductor, wherein the conductor is in a liquid state; and using the conductor to contact a surface of the test object for testing the electric characteristic of the test object. Thus, damage to the test object during the test can be effectively avoided.

21 Claims, 3 Drawing Sheets

NON-DESTRUCTIVE CONTACT TEST

CROSS-REFERENCE TO RELATED APPLICATION

This application claims the priority benefit of Taiwan application serial No. 92128046, filed on Oct. 09, 2003.

BACKGROUND OF THE INVENTION

1. Field of the Invention

This invention generally relates to a test method, and more particularly to a non-destructive contact test method.

2. Description of Related Art

Generally, during or after completing the fabrication of the product, a test is performed to check whether the semi-finished or finished product performs the intended functions. Generally, there are two types of tests, namely, a destructive test and a non-destructive test. Because the non-destructive test does not damage the product, it is more commonly applied during certain stages of the manufacturing process in order to check whether the quality of the semi-finished product is acceptable, and the manufacturing process is further continued to the subsequent process stages where the semi-finished product is being tested again, and so on, until the fabrication of the product is complete. However, the non-destructive test is not suitable for all products.

For example, for processing an organic light emitting diode (OLED) array, since the ITO anode connected to the OLED is in a floating state before the organic functional layers are formed on the OLED array substrate, conventional methods of non-destructive testing when applied to the OLED array were found to damage the ITO anode. In general, the conventional test for testing the OLED array includes providing an electrode on the ITO anode of the OLED array and then a probe is used to contact the ITO anode in order to check whether the drive circuit of the pixel works as intended. However, in the aforementioned test, the ITO anode will get damaged, accordingly the tested OLED has to be scrapped or discarded. Accordingly, a normally non-destructive test, when applied to OLED processing, turns into a destructive test.

SUMMARY OF THE INVENTION

The present invention provides a novel test method and apparatus that overcome the drawbacks in the prior art methods and apparatuses for testing OLED arrays. According to the present invention, a test probe having a liquid conductive contact is used to conduct contact testing, without damaging the contacted structure. The conductive contact is maintained in a liquid state at the intended test temperature.

Accordingly, the present invention provides a non-destructive contact test method capable of not damaging the test product.

The present invention provides a non-destructive contact test method such that the tested product works as intended even after undergoing the non-destructive contact test.

Further, the present invention provides an apparatus suitable for performing the above non-destructive contact test method.

The present invention provides a non-destructive contact test method to test an electric characteristic of a test object. According to an embodiment of the present invention, an apparatus suitable for performing the non-destructive contact test method is provided. The apparatus comprises a conductor, wherein the conductor is in a liquid state at a testing temperature. The conductor is used to contact a surface of the test object in order to test the electric characteristic of the test object.

The present invention provides a non-destructive contact test method for testing an electric characteristic of an active array (e.g., an OLED array) under a testing temperature, wherein the active array includes a plurality of pixels. The method comprises providing an apparatus (in step (a)). The apparatus comprises a plurality of conductors, wherein the conductors are in the liquid state at a testing temperature. The conductors are used to contact the surfaces of the pixels (in step (b)). Thereafter, the electric characteristics of the pixels are tested (in step (c)).

The present invention provides an apparatus suitable for performing the non-destructive contact test method. The apparatus comprises a body having an opening and at least a conductor. A portion of the conductor is exposed to the outside of the body through the opening for contacting a surface of the test object. The conductor is in a liquid state at a testing temperature.

According to an embodiment of the present invention, the conductor has a low resistance and a low melting point and the conductor can be transformed to a liquid state by heating or other methods. A surface of the conductor in the liquid state will have a convex shape due to the cohesive forces. The liquid conductor is used for contacting the test object, and therefore the conductor will not damage the test object. In addition, the problems due to undesirable high resistance can be avoided, which would otherwise cause a test error.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE EMBODIMENTS

The present invention improves the conventional testing method to prevent the test object from getting damaged during the test. The following embodiments use the active OLED array as a test object as an example, and therefore should not be used to limit the spirit and scope of the present invention.

First Embodiment

Figure 1:
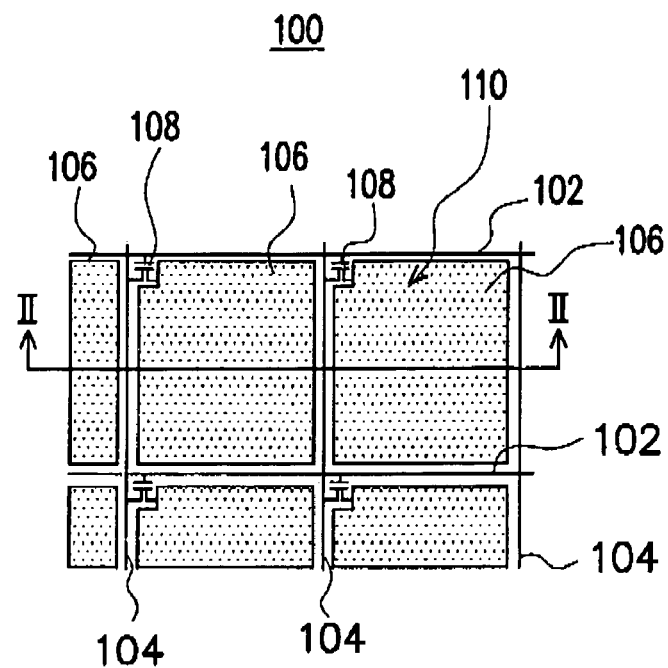
FIG. 1 is a schematic top view of an active device OLED array.

FIG. 1 is a schematic top view of an active OLED array. As shown in FIG. 1, an active array 100 comprises a plurality of scan lines 102, a plurality of data lines 104, a plurality of pixel electrodes 106 and a plurality of active devices 108. The material of the pixels 106 can be ITO. The scan lines 102 and the data lines 104 define a plurality of pixels 110. The pixel electrode 106 is formed in each of the pixels 110. The active devices 108 are coupled to the scan lines 102, the data lines 104, and the pixel electrodes 106. The method of testing whether the drive circuit of each pixel 110 works as intended is described with reference to FIG. 2 as follows.

Figure 2:
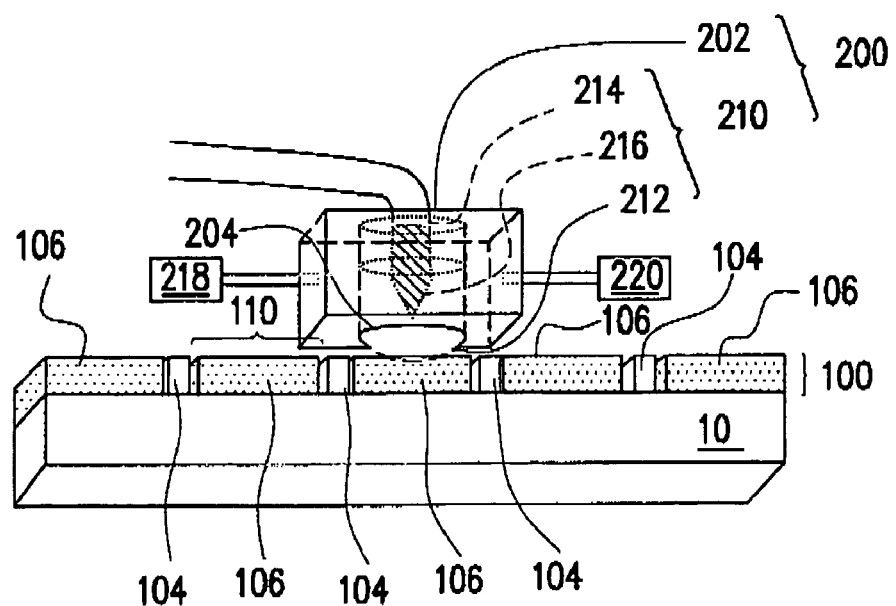
FIG. 2 is a prospective view illustrating a non-destructive contact test method using an apparatus according to a first embodiment of the present invention.

FIG. 2 is a prospective view illustrating a non-destructive contact test method using an apparatus according to a first embodiment of the present invention. The test object is, for example, the pixel electrode 106 of the active array 100 shown in FIG. 1.

Referring to FIG. 2, the apparatus 200 is used for testing an electric characteristic of a test object (such as the pixel electrode 106) under a testing temperature. The apparatus 200 comprises a body 202 having an opening 204 and a device 210 for holding a conductor 212. The conductor 212 is in a liquid state at a testing temperature. The body 202 can be a movable device. The opening 204 can be designed into any shape, preferably a round shape. The device 210 is set inside the body 202. For example, when the body 202 is made of an insulating material, the device 210 includes a conducting line 214. A portion of the conductor 212 is exposed to outside the body 202 via the opening 204 for contacting a surface of the pixel electrode 106. The conducting line 214 is coupled to the conductor 212. Further, as shown in FIG. 2, the exposed portion of the conductor 212 will have a convex shape due to the cohesive forces (i.e., a meniscus is formed at the opening 204). The liquid conductor 212 is held in the opening by the cohesive surface tension forces against its own weight.

The melting point of the conductor 212 is lower than the testing temperature so that the conductor is in the liquid state during the test. In this embodiment, the melting point of the conductor 212 is lower than 400° C, so that testing temperature will not undesirably change the electrical characteristic of the test object, which would otherwise cause a test error. In addition, if the conductor 212 is in a solid state at a temperature below the testing temperature, a heater (schematically represented by block 218; e.g., a heater coil) can be included in the apparatus 200 for heating the conductor 212 to the testing temperature. Accordingly, the conductor 212 can be transformed into a liquid state before the conductor 212 is used to contact the surface of the pixel electrode 110. On the other hand, if the conductor 212 is in a liquid state below the testing temperature (e.g., mercury (Hg)), then the heater 218 is not required.

Still referring to FIG. 2, for testing the electric characteristics of the test object, the conductor 212 in the liquid state is used as a probe to contact the surface of the pixel electrode 106. The above test can be performed on one or more pixels and the results of the above test determine whether or not the pixels work as intended. In addition, the device 210 can further include a probe 216. The probe 216 is connected to the conducting line 214 and the conductor 212 in the liquid state. Further, the apparatus 200 includes a height adjustment system (schematically represented by block 220) that can be used for adjusting the height of exposed portion of the conductor 212 by controlling the pressure inside the body 202. In addition, the apparatus 200 can be moved to adjust the extent of the contact of the conductor 212 with the pixel electrode 106.

Second Embodiment

Figure 3A:
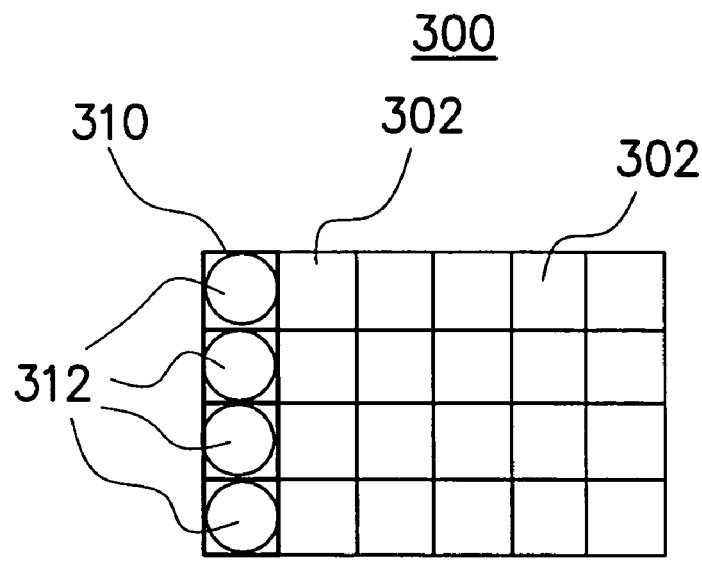
FIGS. 3A and 3B are the top views illustrating a non-destructive contact test method according to a second embodiment of the present invention.
Figure 3B:
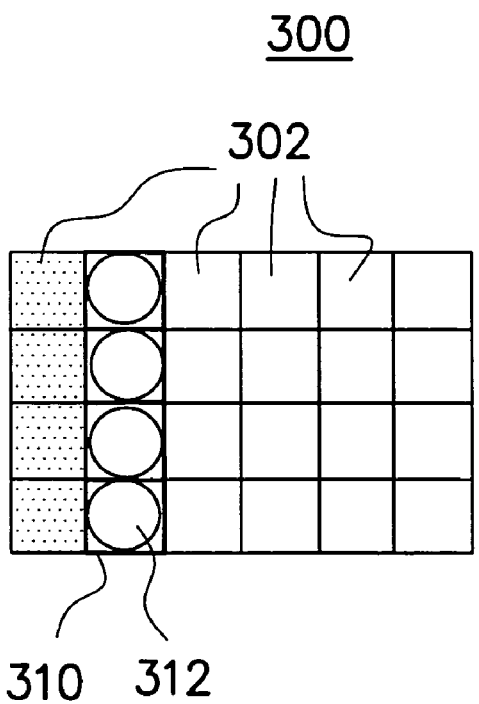

FIGS. 3A and 3B are top views illustrating a non-destructive contact test method using an apparatus according to a second embodiment of the present invention. Referring to FIG. 3A, an apparatus 310 suitable for performing the non-destructive contact test method is provided. The apparatus 310 comprises a plurality of conductors 312. The conductors 312 are in a liquid state at the testing temperature. The conductors 312 are used to contact the surfaces of the plurality of pixels 302 for testing the electrical characteristics of the pixels 302 to check whether the pixels 302 work as intended. As shown in FIG. 3A, some of the pixels 302 that are not being tested can be tested in the subsequent steps, which will be described with reference to FIG. 3B as follows.

Referring to FIG. 3B, the apparatus 310 is moved towards the right direction in order to align the apparatus 310 over the plurality of pixels 302 located in the next column and then the above procedure is repeated to test electrical characteristics of these pixels. As shown in FIG. 3B, the pixels shown in dots represent that these pixels have been already tested. Accordingly, the testing process is continued until the test of checking the electric characteristics of each and every pixels 302 are completed.

Figure 4:
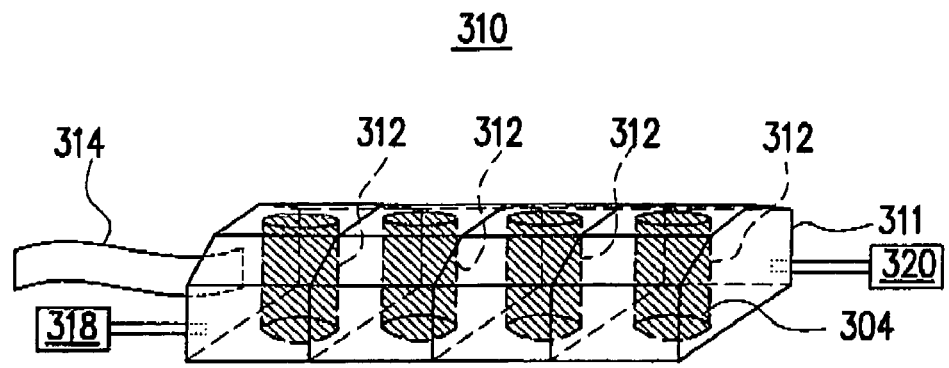
FIG. 4 is a prospective view of an apparatus suitable for performing a non-destructive contact test method according to a second embodiment of the present invention.

FIG 4 is the prospective view illustrating an apparatus suitable for performing a non-destructive contact test according to a second preferred embodiment of the present invention. The apparatus 310 of this embodiment is similar to the apparatus 200 shown in FIG. 2, comprising a body 311 having a plurality of openings 304 adapted for holding a plurality of conductors 312, a heater (schematically represented by block 318), and a height adjustment system (schematically represented by block 320). The conductors 312 are in a liquid state at the testing temperature, and a portion of the conductors 312 are exposed to outside the body 311 via the openings 304 for contacting the surfaces of the pixels 302. When the body 311 is comprised of a conductive material, the apparatus 310 includes a common conducting line 314 connected to the body 311 to provide a voltage to the conductors 312. The openings 304 in this embodiment are arranged in an array. The arrangement of the openings 304 can be flexible and will depend on the shape and arrangement of the test objects such that the area of the exposed portion of the conductor 312 is smaller than the area of the test object.

Third Embodiment

Figure 5:
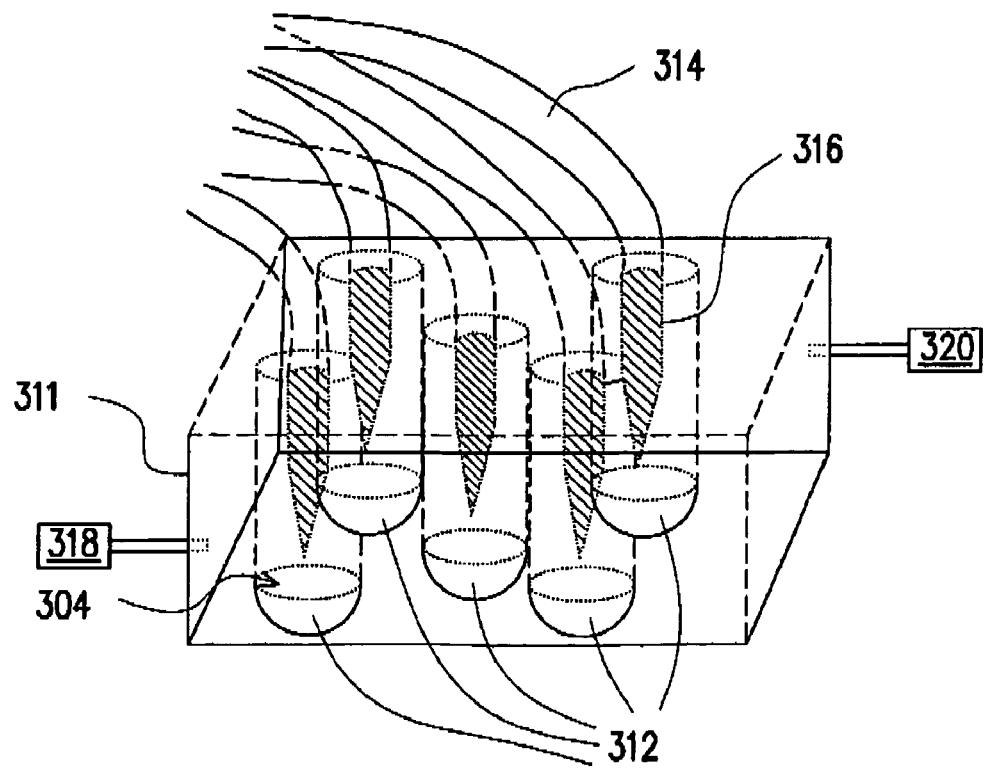
FIG. 5 is the prospective view of an apparatus suitable for performing a non-destructive contact test according to a third preferred embodiment of the present invention.

FIG. 5 is a prospective view illustrating an apparatus suitable for performing a non-destructive contact test according to a third embodiment of the present invention. The apparatus is similar to the apparatus 200 shown in FIG. 2 except for the body 311 having a plurality of openings 304 for holding a plurality of conductors 312 therein are arranged in a zig-zag manner. Further, the apparatus comprises a plurality of conducting line 314 coupled to the conductors 312. Furthermore, a probe 316 is provided for connecting the conducting line 314 and the conductor 312.

Furthermore, in the above embodiments, other devices (not shown), such as an analyzer to analyze the reliability of the test object according to the electric characteristic thereof, and the like, are incorporated in the apparatus.

The present invention teaches the use of a low resistance and a low melting point conductor, such that the conductor is in the liquid state at the testing temperature, to contact the surface of the test object so that damage to the test object can be effectively prevented. In addition, because low temperature and low resistance conductors are used for testing the electric characteristics of the test object, and therefore undesirable errors due to high resistance can be effectively avoided.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A non-destructive contact test method, for testing electric characteristics of a test object comprising:
   providing an apparatus, comprising a conductor, said conductor being in a liquid state at a testing temperature; and
   using said conductor to contact a surface of said test object for testing electric characteristics of said test object, wherein said test object is an active array comprising a plurality of pixels.

2. The method of claim 1, wherein said conductor has a melting point lower than said testing temperature and said conductor is in a liquid state at said testing temperature.

3. The method of claim 2, further comprising a step of heating said conductor to transform said conductor into a liquid state before the step of using said conductor to contact said surface of said test object.

4. The method of claim 2, wherein said conductor has a melting point lower than 400° C.

5. The method of claim 4, wherein said conductor comprises mercury (Hg).

6. The method of claim 1, further including using a height adjustment system to adjust a height of said conductor in the liquid state.

7. A non-destructive contact test method, for testing electric characteristics of a test object, wherein said test object is an active array, said active array comprising a plurality of pixels, said method comprising: (a) providing an apparatus comprising a plurality of conductors, said plurality of conductors being in a liquid state at a testing temperature;
   (b) contacting contact surfaces of a partial number of said pixels using said conductors; and
   (c) testing electric characteristics of said partial number of pixels.

8. The method of claim 7, further comprising a step (d) of moving said apparatus to align over pixels other than said partial number of pixels after the step (c); and
   repeating said steps (b), (c) and (d) until the testing of the electrical characteristics of each of said pixels are completed.

9. The method of claim 7, wherein said plurality of conductors has a melting point lower than 400° C.

10. The method of claim 7, wherein said conductor has a melting point lower than said testing temperature.

11. The method of claim 10, further comprising a step of heating said conductor to transform said conductor into a liquid state before the step of using said conductor to contact said surface of said test object.

12. The method of claim 7, wherein said apparatus further comprising a height adjustment system adjusting a height of said conductor in the liquid state.

13. An apparatus suitable for testing an electric characteristic of a test object, comprising:
   a body, having an opening;
   at least a conductor, said conductor being in a liquid state at a testing temperature, a portion of which is being exposed outside said body via said opening for contacting a surface of said test object, and being in a solid state at a temperature below the testing temperature; and
   a heater heating said conductor to transform said conductor from solid state to liquid state, and to maintain said conductor in a liquid state during testing.

14. The apparatus of claim 13, wherein said conductor has a melting point lower than said testing temperature.

15. The apparatus of claim 13, wherein said conductor comprises mercury (Hg).

16. The apparatus of claim 13, further comprising a height adjustment system, adjusting a pressure within, the body to adjust a height of the exposed portion of the conductor at the liquid state.

17. The apparatus of claim 13, wherein said body is an insulating material.

18. The apparatus of claim 13 wherein said body is a conductive material.

19. The apparatus of claim 18, further comprising a common conducting line connected to said body.

20. A method of in process testing electrical characteristics of an OLED array structure, comprising the steps of:
   providing a test probe comprising a liquid conductive probe, wherein a portion of the liquid conductive probe extend outside the test probe;
   adjusting a pressure within the test probe to adjust a height of said extended portion of the liquid conductive probe by using a height adjustment system;
   contacting a test surface in the OLED array structure using the liquid conductive probe; and
   obtaining data pertaining to the electrical characteristic of the OLED array structure.

21. The method of claim 7, wherein said conductor comprises mercury (Hg).

* * * * *